(12) United States Patent
Liang et al.

(10) Patent No.: US 11,830,889 B2
(45) Date of Patent: Nov. 28, 2023

(54) SEMICONDUCTOR DEVICE AND METHOD OF FORMING THE SAME

(71) Applicant: TAIWAN SEMICONDUCTOR MANUFACTURING COMPANY, LTD., Hsinchu (TW)

(72) Inventors: Victor Chiang Liang, Hsinchu (TW); Fu-Huan Tsai, Hsinchu (TW); Chi-Feng Huang, Hsinchu (TW); Yu-Lin Wei, Hsinchu (TW); Fang-Ting Kuo, Hsinchu (TW); Meng-Chang Ho, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 68 days.

(21) Appl. No.: 17/384,355

(22) Filed: Jul. 23, 2021

(65) Prior Publication Data

US 2021/0351210 A1    Nov. 11, 2021

Related U.S. Application Data

(63) Continuation of application No. 16/738,943, filed on Jan. 9, 2020, now Pat. No. 11,094,723, which is a
(Continued)

(51) Int. Cl.
*H01L 27/146*  (2006.01)
*H01L 29/66*  (2006.01)
(Continued)

(52) U.S. Cl.
CPC .... *H01L 27/14603* (2013.01); *H01L 27/0733* (2013.01); *H01L 27/1463* (2013.01);
(Continued)

(58) Field of Classification Search
CPC .......... H01L 27/14603; H01L 27/0733; H01L 27/14614; H01L 27/1463; H01L 27/14689; H01L 29/66174; H01L 29/93
(Continued)

(56) References Cited

U.S. PATENT DOCUMENTS

| 4,288,806 A | 9/1981 | Ronen |
|---|---|---|
| 5,006,477 A | 4/1991 | Farb |

(Continued)

FOREIGN PATENT DOCUMENTS

| TW | 200402884 | 2/2004 |
|---|---|---|
| TW | 578314 | 3/2004 |

OTHER PUBLICATIONS

Office Action dated Aug. 17, 2020 from corresponding application No. TW 106110505. (pp. 1-10).

*Primary Examiner* — Tu-Tu V Ho
(74) *Attorney, Agent, or Firm* — Hauptman Ham, LLP

(57) ABSTRACT

A low noise device includes an isolation feature in a substrate. The low noise device further includes a gate stack over a channel in the substrate, wherein the isolation feature is adjacent to the channel. The low noise device further includes a spacer surrounding a portion of the gate stack, wherein an edge of the gate stack is spaced from an edge of the isolation feature adjacent to the spacer by a distance ranging from a minimum spacing distance to about 0.3 microns (μm).

20 Claims, 10 Drawing Sheets

Related U.S. Application Data continuation of application No. 15/954,305, filed on Apr. 16, 2018, now Pat. No. 10,535,686, which is a continuation of application No. 15/428,356, filed on Feb. 9, 2017, now Pat. No. 9,947,701.

(60) Provisional application No. 62/343,425, filed on May 31, 2016.

(51) Int. Cl.
    *H01L 27/07*     (2006.01)
    *H01L 29/93*     (2006.01)

(52) U.S. Cl.
    CPC .. *H01L 27/14614* (2013.01); *H01L 27/14689* (2013.01); *H01L 29/66174* (2013.01); *H01L 29/93* (2013.01)

(58) Field of Classification Search
    USPC ........................................................ 257/312
    See application file for complete search history.

(56) References Cited

U.S. PATENT DOCUMENTS

| | | |
|---|---|---|
| 5,405,806 A | 4/1995 | Pfiester et al. |
| 6,468,878 B1 | 10/2002 | Petruzzello et al. |
| 7,235,862 B2 | 6/2007 | Bulucea |
| 7,737,009 B2 | 6/2010 | Lindsay et al. |
| 9,196,728 B2 | 11/2015 | Sridhar |
| 2003/0067026 A1 | 4/2003 | Bulucea |
| 2005/0062129 A1 | 3/2005 | Komatsubara |
| 2006/0049444 A1 | 3/2006 | Shino |
| 2009/0042359 A1 | 2/2009 | Lindsay et al. |
| 2009/0203189 A1 | 8/2009 | Shin et al. |
| 2009/0315138 A1* | 12/2009 | Chang ............... H01L 29/78615 438/585 |
| 2011/0108916 A1 | 5/2011 | Calabrese et al. |
| 2013/0082312 A1* | 4/2013 | Hung .................. H01L 27/1463 257/E21.546 |
| 2014/0042506 A1 | 2/2014 | Ramberg et al. |
| 2015/0249126 A1* | 9/2015 | Kataoka ............ H01L 29/66659 257/343 |

\* cited by examiner

SEMICONDUCTOR DEVICE AND METHOD OF FORMING THE SAME

PRIORITY CLAIM

The present application is a continuation of U.S. application Ser. No. 16/738,943, filed Jan. 9, 2020, which is a continuation of U.S. application Ser. No. 15/954,305, filed Apr. 16, 2018, now U.S. Pat. No. 10,535,686, issued Jan. 14, 2020, which is a continuation of U.S. application Ser. No. 15/428,356, filed Feb. 9, 2017, now U.S. Pat. No. 9,947,701, issued Apr. 17, 2018, which claims the priority of U.S. Provisional Application No. 62/343,425, filed May 31, 2016, which are incorporated herein by reference in their entireties.

BACKGROUND

Transistors are used to form a variety of electronic devices. A popular type of transistor is a complementary metal-oxide-semiconductor (CMOS) transistor because of a relatively low power consumption, speed and ease of manufacture. CMOS transistors are used in devices such as a CMOS image sensor (CIS). CIS are susceptible to random telegraph signal (RTS) noise and flicker noise, which reduces the sensitivity of the CIS.

A source of RTS noise and flicker noise in CIS is trapped charge carriers at an interface between a channel and an isolation feature. Charge carriers become trapped at the interface of the channel and the isolation feature during periods of conductivity for the transistor. In some instances, the trapped charge carriers are embedded in a surface of the isolation feature or in a surface of a gate dielectric layer of the transistor. As these trapped charge carriers break free of the isolation feature or gate dielectric layer, a current through the channel experiences unpredictable increases which results in noise in the output of the transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
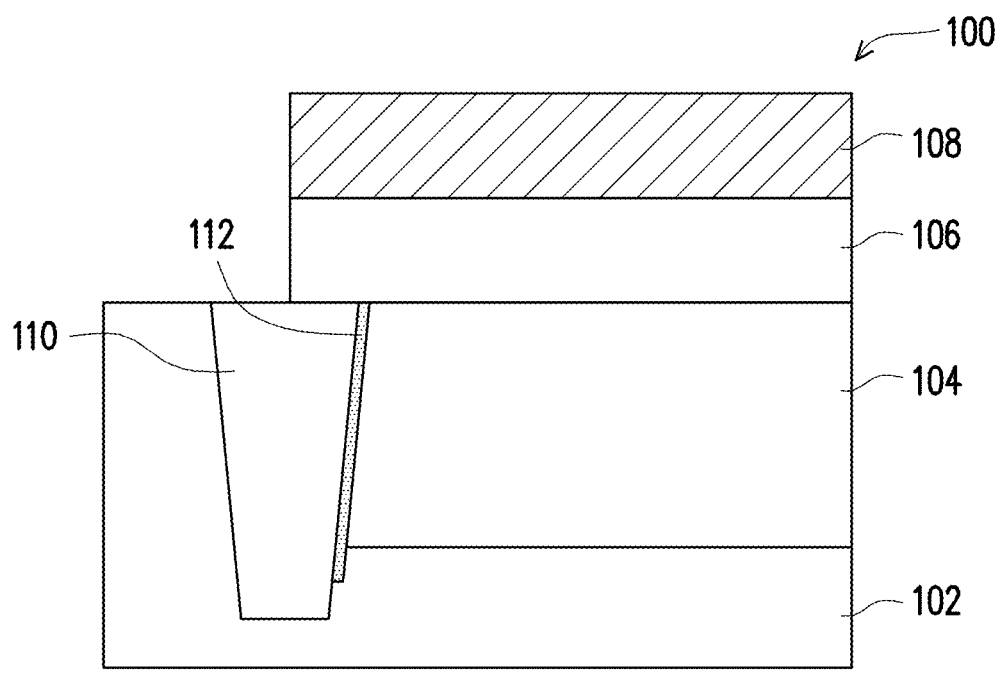
FIG. 1A is a cross-sectional view of a low noise device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to reduce random telegraph signal (RTS) noise and/or flicker noise, a low noise device is designed to limit a number of trapped charge carriers at an interface between a channel and an isolation feature. Reducing the number of trapped charge carriers reduces the risk of trapped charge carriers escaping from the channel/isolation feature interface and causing fluctuations in a current through a transistor. The number of trapped charge carriers is reduced by at least one of implanting ions into the channel/isolation feature interface, introducing a contact to form a varactor, adding an isolation feature overhang to space a current carrying area of the channel from the channel/isolation feature interface, or forming a dielectric spacing element over a portion of a channel adjacent to an isolation feature. In some embodiments, these structures are called charge trapping reducing structures. These different approaches are usable individually or in combination to help reduce an amount of noise within a device. Reducing the noise in the device, such as a CIS, will improve the sensitivity of the sensor in order to increase image quality.

FIG. 1A is a cross-sectional view of a low noise device 100 in accordance with some embodiments. Low noise device 100 includes a substrate 102 and a channel 104 in substrate 102. A gate dielectric layer 106 extends over channel 104; and a gate electrode layer 108 is over gate dielectric layer 106. An isolation feature 110 is located in substrate 102. Gate dielectric layer 106 and gate electrode layer 108 extend over a top surface of isolation feature 110. A portion of the top surface of isolation feature 110 is exposed by gate dielectric layer 106 and gate electrode layer 108. An implant region 112 is located at an interface of channel 104 and isolation feature 110. Implant region 112 extends below channel 104. A depth of isolation feature 110 is greater than a depth of implant region 112.

Substrate 102 is a semiconductor element for supporting components of low noise device 100. In some embodiments, substrate 102 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, substrate 102 is doped. In some embodiments, substrate 102 is undoped or unintentionally doped (UID).

Channel 104 is a region of substrate 102 having a higher dopant concentration than a bulk region of substrate 102. Channel 104 is a conductive path for low noise device 100 in which charge carriers are transferred from one side, e.g., a source, of low noise device 100 to another side, e.g., a drain, of low noise device 100. In some embodiments, channel 104 is n-doped and contains n-type dopants such as phosphorous, arsenic or other suitable n-type dopants. In some embodiments, channel 104 is p-doped and contains p-type dopants such as boron, gallium or other suitable p-type dopants. In some embodiments, a dopant type in channel 104 is a same dopant type as in a doped substrate 102. In some embodiments, the dopant type in channel 104 is opposite the dopant type in a doped substrate 102.

Gate dielectric layer 106 insulates gate electrode 108 from channel 104. Gate dielectric layer 106 has a substantially uniform thickness. Gate dielectric layer 106 extends over a portion of the top surface of isolation feature 110. In some embodiments, gate dielectric layer 106 includes silicon oxide, silicon nitride, silicon oxynitride, or another suitable dielectric material. In some embodiments, gate dielectric layer 106 is a high-k dielectric material, such as hafnium dioxide, zirconium dioxide, titanium dioxide or another suitable high-k dielectric material. A high-k dielectric material has a dielectric constant, k-value, higher than silicon dioxide, i.e., a k-value greater than 3.9.

Gate electrode 108 is a conductive element configured to receive a gate voltage signal for controlling conductivity of channel 104. Gate electrode 108 is in direct contact with gate dielectric layer 106. In some embodiments, gate electrode layer 108 is separated from gate dielectric layer 106 by other layers, such as work-function layers. Gate electrode 108 has a same width as gate dielectric layer 106. In some embodiments, gate electrode 108 has a different width from gate dielectric layer 106. Gate electrode 108 is over a portion of the top surface of isolation feature 110 as gate dielectric layer 106. In some embodiments, gate electrode 108 is over less of the top surface of isolation layer 110 than gate dielectric layer 106. In some embodiments, gate electrode 108 includes a metallic material. In some embodiments, gate electrode 108 includes polysilicon. In some embodiments, gate electrode 108 includes a conductive polymer.

Isolation feature 110 helps to insulate channel 104 from other conductive features in substrate 102. The depth of isolation feature 110 is greater than a depth of channel 104. Isolation feature 110 includes a dielectric material. In some embodiments, isolation feature 110 includes silicon oxide, silicon nitride, silicon oxynitride or another suitable dielectric material. In some embodiments, isolation feature 110 includes both a main portion and a liner between an interface with isolation feature 110 and substrate 102 (including channel 104) and the main portion. A liner is a portion of isolation feature 110 formed along a sidewall of an opening in substrate 102. A main portion of isolation feature 110 is then used to fill a remaining portion of the opening in the substrate. An example of a liner and a main portion are described with respect to FIG. 5A-5E. In some embodiments, a material of the main portion is a same material as the liner. In some embodiments, the material of the main portion is different from the material of the liner. The top surface of isolation feature 110 is substantially co-planar with a top surface of substrate 102. The top surface of isolation feature 110 closest to channel 104 is covered by gate dielectric layer 106 and gate electrode 108. In some embodiments, isolation feature 110 is called a shallow trench isolation (STI).

Implant region 112 is located at an interface between isolation feature 110 and channel 104. Implant region 112 includes a material which has minimal impact on conductivity of isolation feature 110 and channel 104. The material implanted to form implant region 112 is not a p-type or n-type dopant. In some embodiments, the material is called a non-dopant implant. In some embodiments, implant region 112 includes a fluorine-containing material, such as fluorine, boron difluoride or another suitable fluorine containing material. In some embodiments, a concentration of non-dopant implant in implant region 112 is greater than about $1 \times 10^{12}$ ions/cm$^3$. If the concentration of non-dopant implant is too low, then the amount of non-dopant implants is insufficient to hold embedded charge carriers and noise is not sufficiently reduced.

The depth of implant region 112 from an upper surface of channel 104 is greater than the depth of channel 104. In some embodiments, the depth of implant region 112 is less than the depth of channel 104 because charge carriers in channel 104 are most likely to be located adjacent to gate dielectric layer 106. In some embodiments, the depth of implant region 112 is greater than 0.02 microns (µm). If the depth of implant region 112 is too small, a risk of charge carriers embedding in portions of isolation feature 110 which do not include implant region 112 increases. The depth of implant region 112 depends on an energy of an implantation process used to form implant region 112. As the energy increases the depth of implant region 112 increases. The energy of the implantation process is selected to maintain the non-dopant implant at an interface of isolation feature 110 and channel 104.

A thickness of implant region 112 is less than about 20 nanometers (nm). The thickness of the implant region 112 is measured in a direction perpendicular to a sidewall of isolation feature 110. If the thickness of implant region 112 is too great, an insulating ability of isolation feature 110 is reduced.

In some embodiments, implant region 112 includes a portion of isolation feature 110 and channel 104. In some embodiments, implant region 112 is located entirely within isolation feature 110. In some embodiments, implant region 112 includes a portion in substrate 102 outside channel 104. Implant region 112 is located on a single side of isolation feature 110. In some embodiments, implant region 112 is formed by an angled implantation process.

By implanting a material like fluorine at the interface between isolation feature 110 and channel 104, charge carriers which become embedded in isolation feature 110 are held in place by the implanted material. For example, if a trapped charge carrier is a hole, the negatively charged fluorine ion would attract the positively charged hole and prevent the embedded hole from breaking free of isolation feature 110. Reducing the amount of trapped charge carriers that break free of isolation feature 110 helps to reduce fluctuations in the current through channel 104 during operation of low noise device 100 in comparison with devices which do not include implant region 112.

Figure 1B:
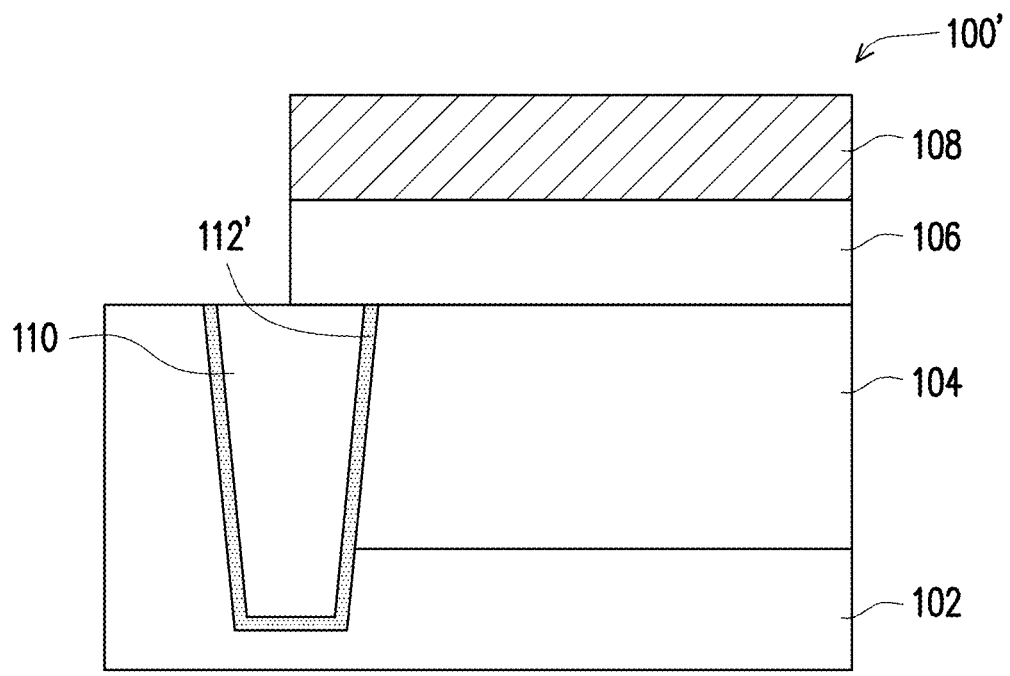
FIG. 1B is a cross-sectional view of a low noise device in accordance with some embodiments.

FIG. 1B is a cross-sectional view of a low noise device 100' in accordance with some embodiments. Elements in low noise device 100' which are the same as elements in low noise device 100 have a same reference number. In comparison with low noise device 100, low noise device 100' includes implant region 112' which extends around an entirety of isolation feature 110 in substrate 102. Implant region 112' extends along sidewalls and a bottom surface of isolation feature 110. In comparison with the angled implant used to form implant region 112, implant region 112' is formed using a vertical implantation process, in some embodiments.

Figure 2A:
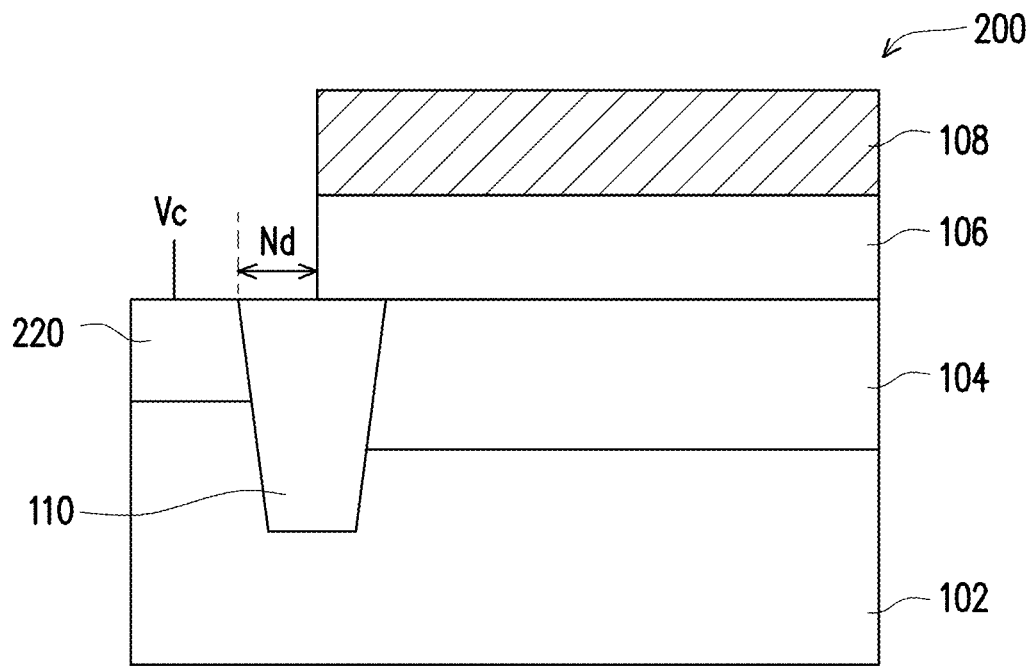
FIG. 2A is a cross-sectional view of a low noise device in accordance with some embodiments.

FIG. 2A is a cross-sectional view of a low noise device 200 in accordance with some embodiments. Low noise device 200 includes some of the same elements as low noise device 100. Same elements have a same reference number. In comparison with low noise device 100, low noise device 200 includes a contact area 220 on an opposite side of isolation feature 110 from channel 104. A distance Nd from an edge of contact 220 to an edge of gate dielectric layer 106 is greater than zero. Contact 220 is configured to form a varactor with channel 104. A varactor is a type of diode which has a variable capacitance based on a voltage applied. Contact 220 is configured to receive a voltage Vc which is usable to adjust the capacitance of the varactor.

Contact 220 is formed by implanting a dopant into substrate 102. In some embodiments, the implantation process is a vertical implantation process. In some embodiments, the implantation process is an angled implantation process.

A dopant concentration of contact 220 is greater than a dopant concentration of channel 104. The dopant concentration of contact 220 is at least about $1 \times 10^{11}$ ions/cm$^3$. As a dopant concentration of contact 220 decreases, an ohmic contact between a contact line for providing voltage Vc and contact 220 has too much resistance, in some instances. A depth of contact 220 is less than the depth of channel 104. In some embodiments, the depth of contact 220 is greater than or equal to the depth of channel 104. In some embodiments, a dopant type of contact 220 is a same dopant type as channel 104. In some embodiments, the dopant type of contact 220 is different from the dopant type of channel 104. In some embodiments, a species of dopant in contact 220 is a same species as in channel 104. In some embodiments, the species of dopant in contact 220 is different from the species of channel 104.

Distance Nd helps to prevent an electrical path from gate electrode 108 to contact 220 which could prevent low noise device 200 from functioning as intended. In some embodiments, distance Nd is equal to a smallest distance which is able to be reliably manufactured. In some instances, the smallest distance which is able to be reliably manufactured is called a minimum spacing distance. In some embodiments, distance Nd is less than about 0.3 μm. As distance Nd increases, then the impact of the varactor formed by contact 220 is reduced.

Including contact 220 in low noise device 200 helps to create a charge carrier depletion region adjacent to the interface of isolation feature 110 and channel 104. By applying voltage Vc to contact 220, a size of the charge carrier depletion region is adjusted. The charge carrier depletion region has a lower number of charge carriers than other portions of channel 104. Reducing the number of charge carriers in the depletion region reduces the risk of charge carriers becoming trapped at the interface of isolation feature 110 and channel 104. Additionally, adjusting voltage Vc helps to tune a work function of low noise device 200.

Figure 2B:
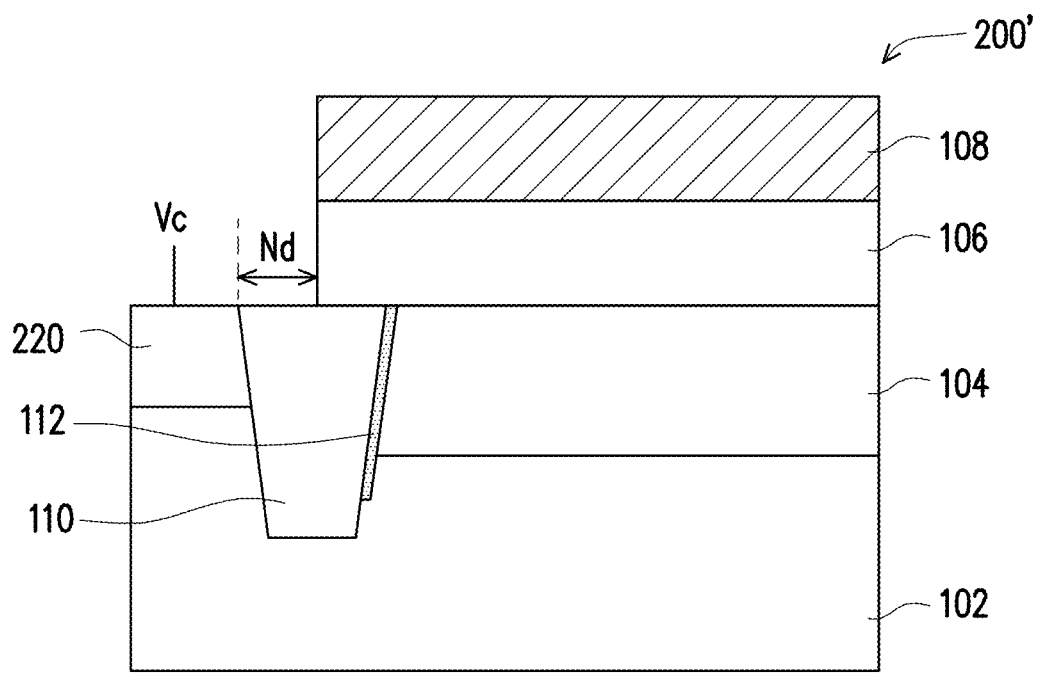
FIG. 2B is a cross-sectional view of a low noise device in accordance with some embodiments.

FIG. 2B is a cross-sectional view of a low noise device 200' in accordance with some embodiments. Elements in low noise device 200' which are the same as elements in low noise device 200 have a same reference number. In comparison with low noise device 200, low noise device 200' includes implant region 112 similar to low noise device 100 (FIG. 1A). In some embodiments, low noise device 200' includes an implant region 112' similar to low noise device 100' (FIG. 1B). In some embodiments, low noise device 200' includes implant region 112' which extends around an entirety of isolation feature 110 in substrate 102. In some embodiments, implant region 112' is located between contact 220 and isolation feature 110.

The combination of implant region 112 and contact 220 helps to further reduce trapped charge carriers at the interface of isolation feature 110 and channel 104. Contact 220 forms a varactor which creates the depletion region reducing the number of charge carriers near the interface. Implant region 112 helps hold any charge carriers which become embedded in isolation feature 110. The combination of the increased ability to hold trapped charge carriers along with a reduced number of charge carriers at the interface of isolation feature 110 and channel 104 helps to further reduce noise in comparison to other devices.

Figure 3A:
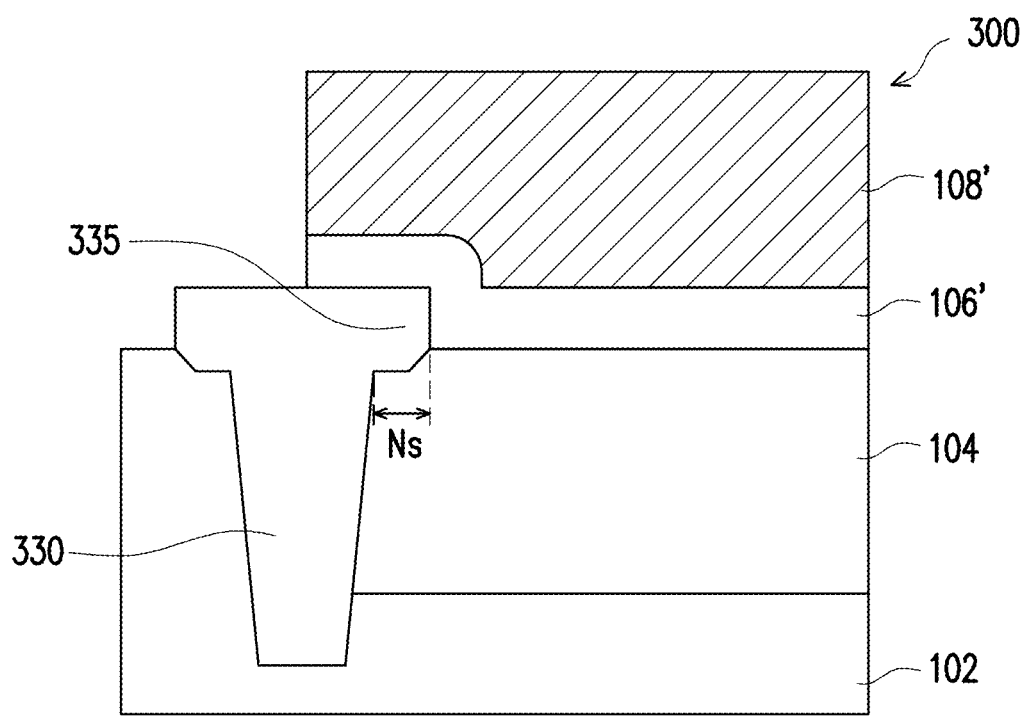
FIG. 3A is a cross-sectional view of a low noise device in accordance with some embodiments.

FIG. 3A is a cross-sectional view of a low noise device 300 in accordance with some embodiments. Low noise device 300 includes some of the same elements as low noise device 100. Same elements have a same reference number. In comparison with low noise device 100, low noise device 300 includes isolation feature 330 having an isolation overhang 335, which extends along a top surface of channel 104. Low noise device 300 also includes a gate dielectric layer 106' and a gate electrode 108'. In comparison with gate dielectric layer 106 (FIG. 1A), gate dielectric layer 106' includes a first portion along channel 104 and a second portion along isolation feature 330. A top surface of the first portion of gate dielectric layer 106' is not co-planar with a top surface of the second portion of gate dielectric layer 106' due to portion of isolation feature 330 protruding above substrate 102. In comparison with gate electrode 108, gate electrode 108' has a first portion having a first thickness and a second portion having a second thickness different from the first thickness. The first portion of gate electrode 108' is over the first portion of gate dielectric layer 106'; and the second portion of gate electrode 108' is over the second portion of gate dielectric layer 106'. The second portion of gate electrode 108' has a different thickness due to the portion of isolation feature 330 protruding above substrate 102, which reduces a distance between the top surface of isolation feature 330 and a top surface of gate electrode 108' in comparison with a similar measuring for isolation feature 110 and gate electrode 108.

Isolation overhang 335 is formed using a mask pull-back process. The mask pull-back process includes widening an opening in a mask following formation of a trench in substrate 102. The widened opening exposes a portion of channel 104. The dielectric material for forming isolation feature 330 is then used to fill both the trench in substrate 102 and the widened opening in the mask layer resulting in isolation overhang 335. In some embodiments, the mask layer is a photoresist material. In some embodiments, the mask layer is a hard mask, such as silicon nitride or another suitable hard mask material.

Isolation overhang 335 helps to ensure that the entire opening for isolation feature 330 is filled. In comparison with an isolation feature which does not include an isolation overhang, isolation overhang 335 helps to reduce an electrical field at a corner of channel 104. The reduced electrical field at the corner also helps to increase a threshold voltage (Vt) of low noise device 300 in comparison with other devices.

In comparison with isolation feature 110, isolation feature 330 includes a portion in substrate 102 and a portion above the top surface of substrate 102. Isolation feature 330 includes isolation overhang 335 on both sides of isolation feature 330. In some embodiments, isolation feature 330 includes isolation overhang 335 on only a side of isolation feature 330 closest to channel 104. Isolation overhang 335 extends over channel 104 by a distance Ns.

Distance Ns helps to space a portion of channel 104 in which charge carriers move during operation of low noise device 300 in comparison with low noise device 100 (FIG. 1A). By spacing the portion of channel 104 in which charge carriers move away from the interface of isolation feature 330 and channel 104, a risk of charge carriers becoming trapped at the interface of isolation feature 330 and channel 104 is reduced. In some embodiments, distance Ns is greater than about 5 nm. As distance Ns decreases, the separation between the location of moving charge carriers and the interface of isolation feature 330 and channel 104 is not sufficient to reduce the risk of trapping charge carriers, in some instances. However, increasing distance Ns also reduces the area for conducting charge carriers. As a result, a resistance of low noise device 300 is increased in comparison with other devices which do not include isolation overhang 335; or a size of low noise device 300 is increased in order to maintain a resistance similar to a device which does not include isolation overhang 335.

Figure 3B:
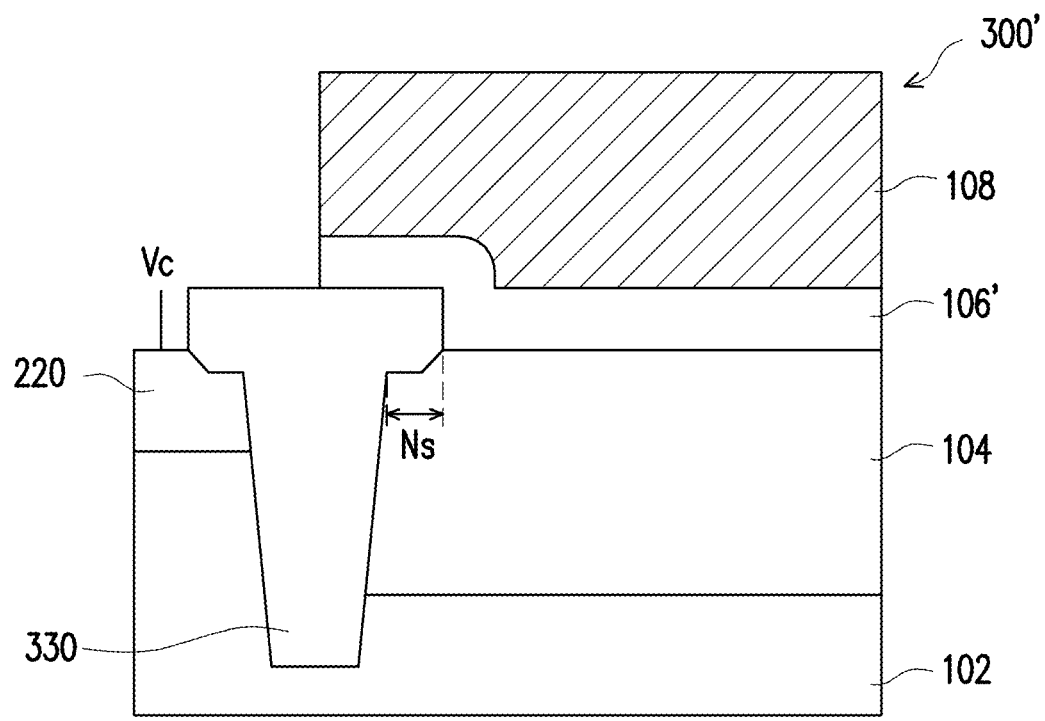
FIG. 3B is a cross-sectional view of a low noise device in accordance with some embodiments.

FIG. 3B is a cross-sectional view of a low noise device 300' in accordance with some embodiments. Elements in low noise device 300' which are the same as elements in low noise device 300 have a same reference number. In comparison with low noise device 300, low noise device 300' includes implant contact 220 similar to low noise device 200 (FIG. 2A).

The combination of isolation overhang 335 and contact 220 helps to further reduce trapped charge carriers at the interface of isolation feature 330 and channel 104. Contact 220 forms a varactor which creates the depletion region reducing the number of charge carriers near the interface. Isolation overhang 335 further helps to separate the moving charge carriers from the interface of isolation feature 330 and channel 104. The combination of contact 220 and isolation overhang 335 helps to further reduce noise in comparison to other devices.

Figure 3C:
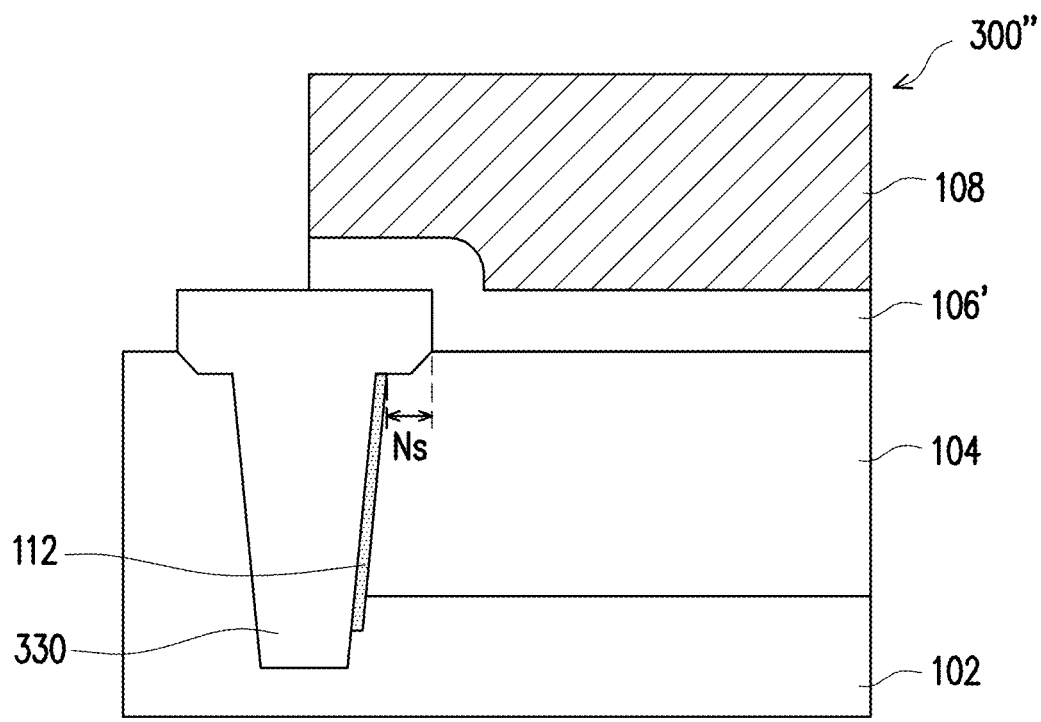
FIG. 3C is a cross-sectional view of a low noise device in accordance with some embodiments.

FIG. 3C is a cross-sectional view of a low noise device 300" in accordance with some embodiments. Elements in low noise device 300" which are the same as elements in low noise device 300 have a same reference number. In comparison with low noise device 300, low noise device 300" includes implant region 112 similar to low noise device 100 (FIG. 1A). In some embodiments, low noise device 300" includes implant region 112' similar to low noise device 100' (FIG. 1B).

The combination of implant region 112 and isolation overhang 335 helps to further reduce trapped charge carriers at the interface of isolation feature 330 and channel 104. Isolation overhang 335 further helps to separate the moving charge carriers from the interface of isolation feature 330 and channel 104. Implant region 112 helps hold any charge carriers which become embedded in isolation feature 330. The combination of the increased ability to hold trapped charge carriers along with a reduced number of charge carriers at the interface of isolation feature 330 and channel 104 helps to further reduce noise in comparison to other devices.

Figure 3D:
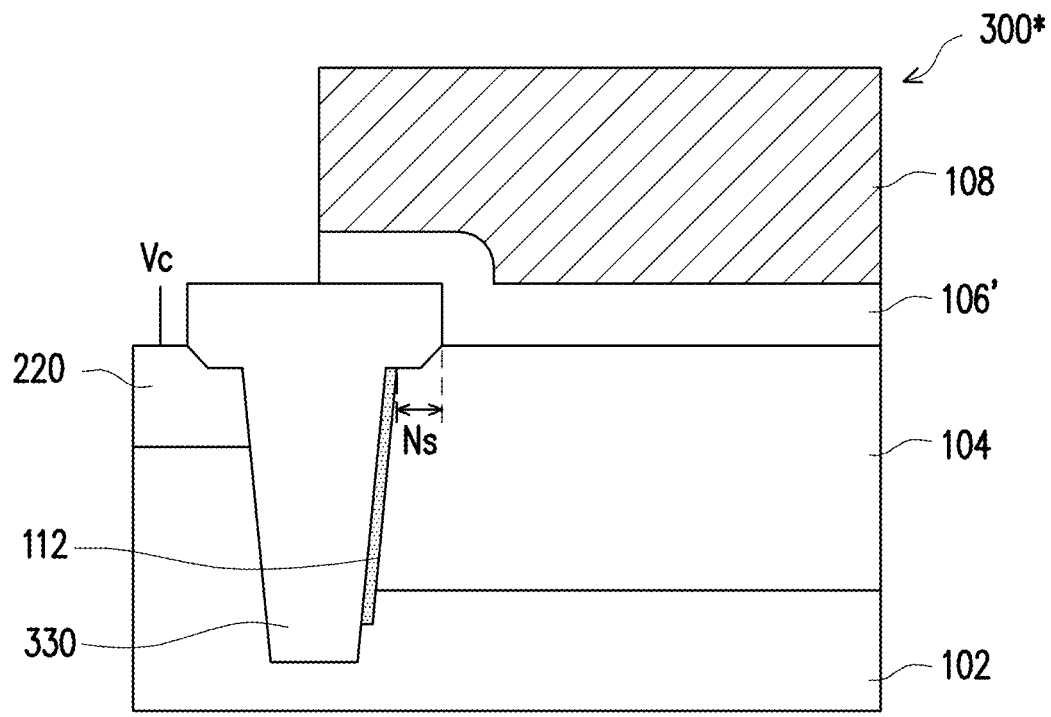
FIG. 3D is a cross-sectional view of a low noise device in accordance with some embodiments.

FIG. 3D is a cross-sectional view of a low noise device 300* in accordance with some embodiments. Elements in low noise device 300* which are the same as elements in low noise device 300 have a same reference number. In comparison with low noise device 300, low noise device 300* includes implant contact 220 similar to low noise device 200 (FIG. 2A); and implant region 112 similar to low noise device 100 (FIG. 1A). In some embodiments, low noise device 300* includes implant region 112' similar to low noise device 100' (FIG. 1B).

The combination of isolation overhang 335, contact 220, and implant region 112 helps to further reduce trapped charge carriers at the interface of isolation feature 330 and channel 104 for reasons similar to those detailed above.

Figure 4:
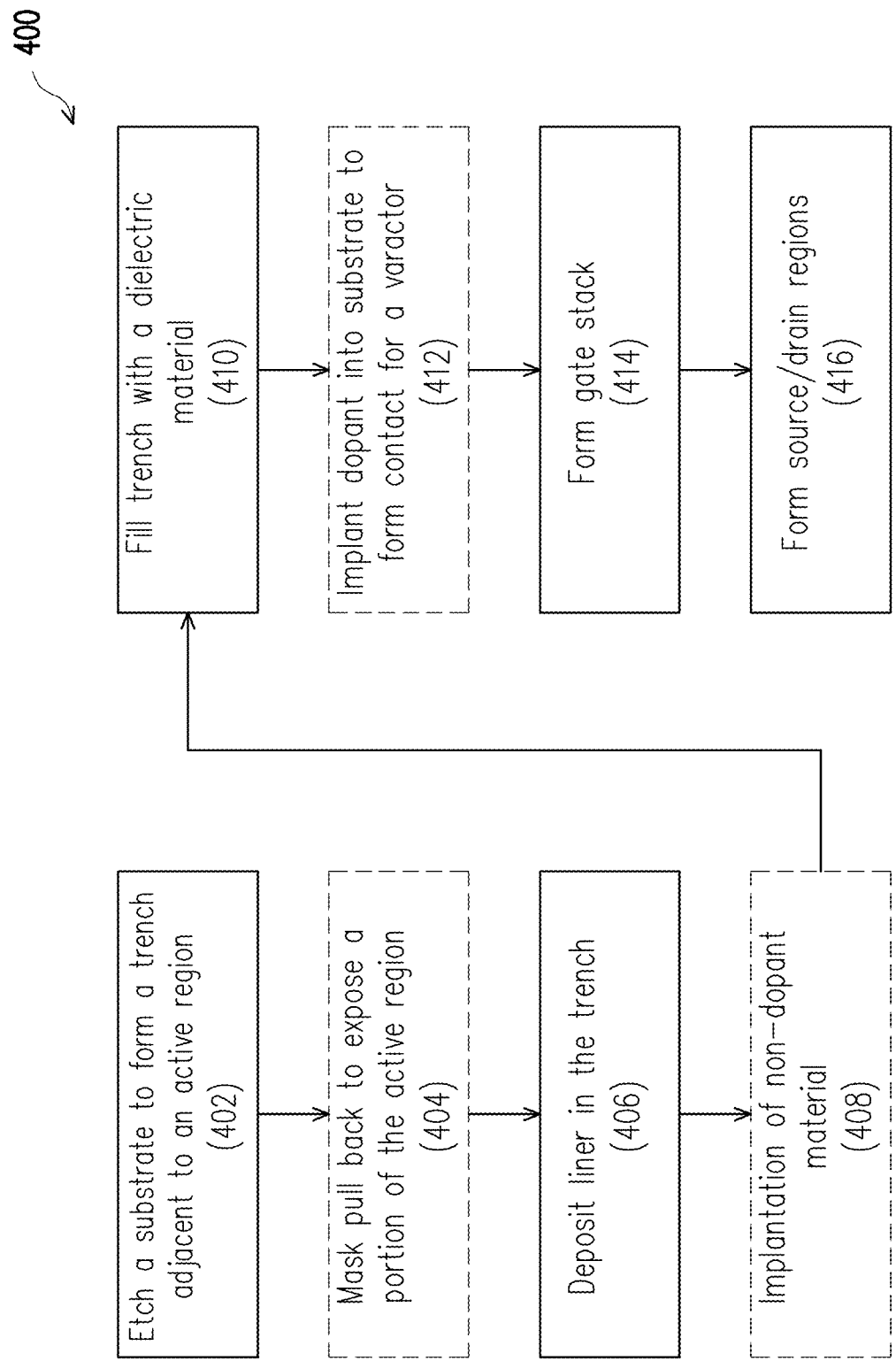
FIG. 4 is a flow chart of a method of making a low noise device in accordance with some embodiments.

FIG. 4 is a flow chart of a method 400 of forming a low noise device in accordance with some embodiments. In operation 402, a substrate is etched to form a trench adjacent to an active region. The substrate is etched to expose a sidewall portion of the active region. In some instances, the active region is called a channel, e.g., channel 104 (FIG. 1A). A depth of the trench is greater than a depth of the active region. In some embodiments, the substrate is etched using a wet etching process, a dry etching process, an electron-beam (e-beam) etching process or another suitable etching process. In some embodiments, sidewalls of the trench are tapered such that a width of the trench adjacent a top surface of the substrate is greater than a width of the trench at a bottom surface of the trench. In some embodiments, sidewalls of the trench are substantially perpendicular.

A mask is deposited over the substrate and patterned in order to define a location of the trench. In some embodiments, the mask is a photoresist material. In some embodiments, the mask is a hard mask material. In some embodiments, the mask includes multiple layers. In some embodiments, the mask includes a single layer. In some embodiments, the mask is removed immediately following formation of the trench.

In operation 404, a mask pull-back process is used to expose a portion of the active region. The mask pull-back process widens an opening in the mask with respect to the opening used to define the location of the trench. The mask pull-back process exposes a portion of a top surface of the active region adjacent to the trench. In some embodiments, the mask pull-back process exposes a portion of the top surface of the substrate on an opposite side of the trench from the active region. In some embodiments, the mask pull-back process includes etching the mask. In some embodiments, mask pull-back process includes depositing a second mask over the mask and patterning the second mask to define a width of the opening following mask pull-back process. Additional details of the mask pull-back process are provided below with respect to FIGS. 5A-5E, in accordance with some embodiments.

The mask pull-back process is used to help form an isolation overhang, e.g., isolation overhang 335 (FIG. 3A). In some embodiments, operation 404 is omitted. Operation 404 is omitted the low noise device formed using method 400 does not have an isolation overhang.

In operation 406, a liner is deposited in the trench. The liner includes a dielectric material. In some embodiments, the liner includes silicon oxide, silicon nitride, silicon carbide, silicon oxynitride or another suitable dielectric material. In some embodiments, the liner is deposited using physical vapor deposition (PVD), chemical vapor deposition (CVD), sputtering or another suitable deposition process. In some embodiments which include operation 404, the liner is deposited along the widened opening in the mask.

In operation 408, a non-dopant material is implanted. The non-dopant material forms an implant region, e.g., implant region 112 (FIG. 1A). The non-dopant material does not significantly impact conductivity of the channel, the substrate or the later formed isolation feature. In some embodiments, the non-dopant material is implanted into the liner. In some embodiments, the non-dopant material is implanted into the active region or the substrate. An energy used during the implantation process determines whether the non-dopant material remains in the liner or is implanted into the active region or substrate. The energy of the implantation process is selected in order to have the non-dopant material located at an interface of the active region and the later formed isolation feature. In some embodiments, the non-dopant material is implanted using a vertical implantation process. In some embodiments, the non-dopant material is implanted using an angle implant process. In some embodiments, the non-dopant material is implanted only in a surface of the trench adjacent to the active region. In some embodiments, the non-dopant material is implanted in all surfaces of the trench.

In some embodiments, the non-dopant material is a fluorine-containing material. In some embodiments, the non-dopant material includes fluorine, boron difluoride, or another suitable fluorine containing material.

In some embodiments, operation 408 is omitted. Operation 408 is omitted when the low noise device formed by method 400 does not include implant region 112 (FIG. 1A) or implant region 112' (FIG. 1B).

In operation 410, a dielectric material fills the trench. The dielectric material fills an entirety of the trench in the substrate. The trench filled with the dielectric material is called an isolation feature, e.g., isolation feature 110 (FIG. 1A) or isolation feature 330 (FIG. 3A). In some embodiments, the dielectric material extends above the top surface of the substrate. In some embodiments, a planarization process, such as chemical mechanical polishing (CMP), is performed to remove the dielectric material above the substrate. In some embodiments which include operation 404, a planarization process is used to remove the dielectric material above the mask. In some embodiments, the trench is filled using PVD, CVD, sputtering or another suitable process. In some embodiments, the trench is filled using a single deposition process. In some embodiments, the trench is filled using multiple deposition processes.

In some embodiments, the dielectric material is a same material as the liner. In some embodiments, the dielectric material is different from a material of the liner. In some embodiments, the dielectric material is silicon oxide, silicon nitride, silicon carbide, silicon oxynitride or another suitable dielectric material.

In operation 412, a dopant is implanted into the substrate to form a contact for a varactor. The dopant is implanted into the substrate on an opposite side of the isolation feature from the active region to form the contact, e.g., contract 220 (FIG. 2A). The dopant is implanted using an ion implantation process. In some embodiments, an annealing process is used in addition to the implantation process. In some embodiments, a dopant type of the dopant is a same dopant type as the active region. In some embodiments, the dopant type of the dopant is different from the dopant type of the active region. In some embodiments, a species of the dopant is different from a species of the active region. In some embodiments, the species of the dopant is different from the species of the active region.

The contact is configured to receive a voltage for controlling a capacitance of the varactor. The dopant is implanted to have a sufficient concentration to form a low resistance ohmic contact with a line for receiving the voltage at the contact. In some embodiments, the dopant concentration in the contact is at least about $1 \times 10^{11}$ ions/cm$^3$.

In some embodiments, operation 412 is omitted. Operation 412 is omitted when the low noise device formed by method 400 does not include a contact, e.g., contact 220 (FIG. 2A), for a varactor.

In operation 414, a gate stack is formed. The gate stack is formed over the active region and extends over the isolation feature. The gate stack includes a gate dielectric layer, e.g., gate dielectric layer 106 (FIG. 1A), and a gate electrode, e.g., gate electrode 108. The gate dielectric layer is deposited over the active region and over a portion of the isolation feature. In some embodiments, the gate dielectric layer is deposited using PVD, CVD, sputtering or another suitable deposition process. In some embodiments, the gate dielectric layer is a high-k dielectric layer. The gate electrode is formed over the gate dielectric layer. In some embodiments, the gate electrode is formed by PVD, CVD, sputtering, plating or another suitable formation process. In some embodiments, gate stack includes additional layers such as a work function layer, an interfacial layer, or another suitable gate stack layer. In some embodiments, spacers are formed along sidewalls of the gate stack.

In operation 416, source/drain features are formed. The source/drain features are formed on opposite sides of the active region. For example, source/drain features for low noise device 100 (FIG. 1A) are separated from each other in a direction perpendicular to the cross-section of FIG. 1A. In some embodiments, the source/drain features are formed by an implantation process. In some embodiments, an annealing process is performed following the implantation process. In some embodiments, the source/drain features are formed by etching recesses in the substrate and depositing the source/drain features in the recesses. In some embodiments, the source/drain features are stressed source/drain features. A stressed source/drain feature has a different crystal structure from the substrate.

In some embodiments, an order of operations for method 400 is changed. For example, in some embodiments, operation 412 is performed prior to operation 402. In some embodiments, some operations for method 400 are omitted. For example, in some embodiments, operation 402 is omitted and the isolation feature is formed using a local oxidation of silicon (LOCOS) process. In some embodiments, additional operations are included in method 400. For example, in some embodiments, method 400 includes an operation for forming the active region in the substrate. In some embodiments, method 400 includes an operation for removing the mask prior to forming the gate stack.

Figure 5A:
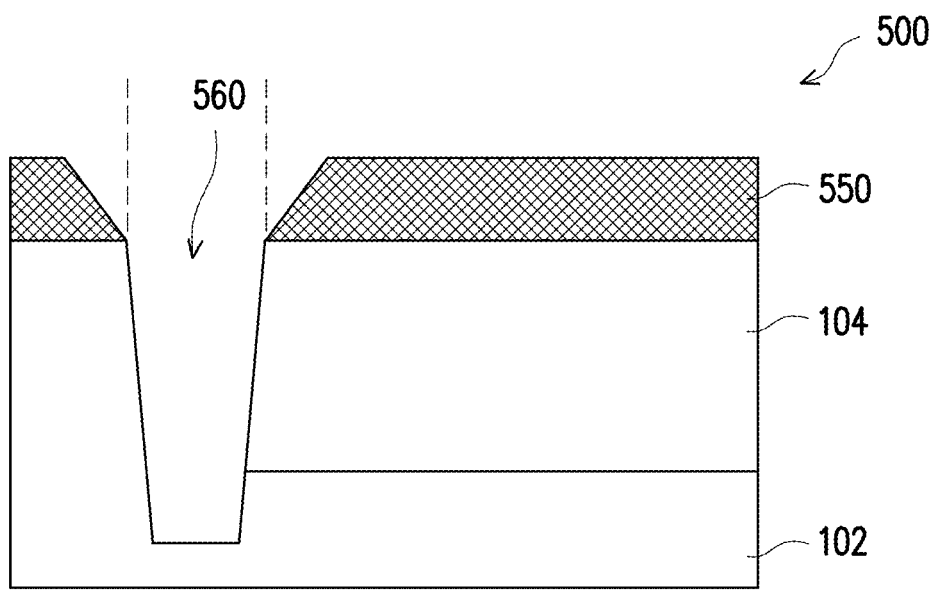
FIGS. 5A-5E are cross-sectional views of a low noise device during various stages of processing in accordance with some embodiments.

FIGS. 5A-5E are cross-sectional views of a low noise device during various stages of processing in accordance with some embodiments. FIG. 5A is a cross-sectional view of a low noise device 500 following etching of substrate 102 to form a trench 560. Elements in low noise device 500 which are the same as low noise device 100 (FIG. 1A) have a same reference number. In some embodiments, low noise device 500 is a structure following operation 402. Low noise device 500 includes a mask 550 over channel 104 and substrate 102. Mask 550 is patterned to define an opening at a location for trench 560. Trench 560 exposes an entire sidewall of channel 104. A depth of trench 560 is greater than a depth of channel 104.

Edges of mask 550 adjacent to trench 560 are aligned with an edge of trench as indicated by dashed lines in FIG. 5A. Sidewalls of mask 550 adjacent to trench 560 are tapered. In some embodiments, sidewalls of mask 550 adjacent to trench 560 are substantially perpendicular to the top surface of substrate 102. Trench 560 has a tapered profile. In some embodiments, sidewalls of trench 560 are substantially perpendicular to the top surface of substrate 102.

In some embodiments, mask 550 is a photoresist. In some embodiments, mask 550 is a hard mask. In some embodiments, mask 550 includes a dielectric material, such as silicon nitride or another suitable dielectric material.

Figure 5B:
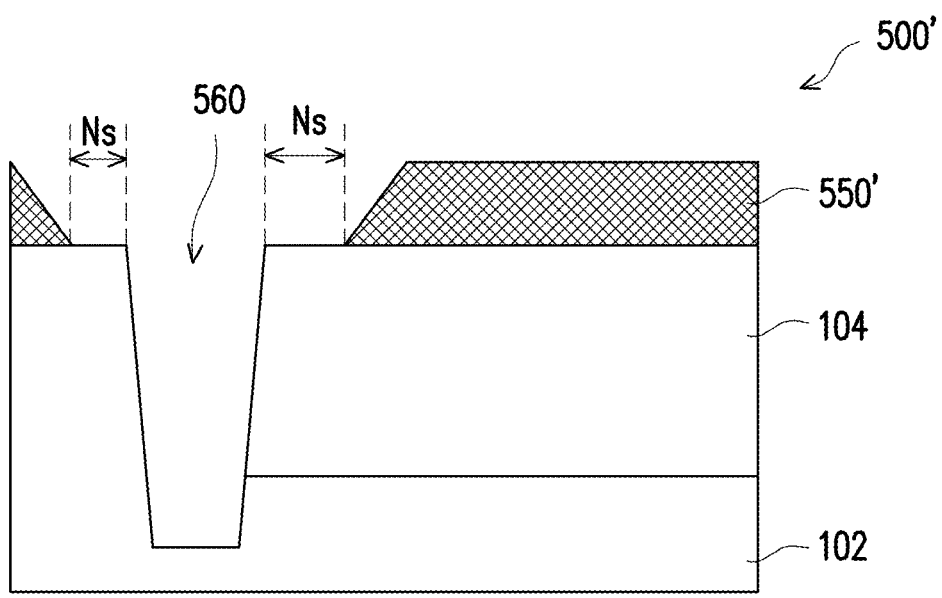

FIG. 5B is a cross-sectional view of a low noise device 500' following a mask pull-back process. In some embodiments, low noise device 500' is a structure following operation 404. In comparison with low noise device 500, low noise device 500' includes mask 550' having edges adjacent to trench 560 spaced from edges of trench 560. The edges of mask 550' are spaced from the edges of trench 560 by distance Ns. Low noise device 550' includes mask 550' edges spaced from edges of trench 560 on both sides of trench 560. In some embodiments, mask 550' includes a first edge spaced from a first edge of trench 560 adjacent to channel 104; and a second edge aligned with a second edge of trench 560.

Figure 5C:
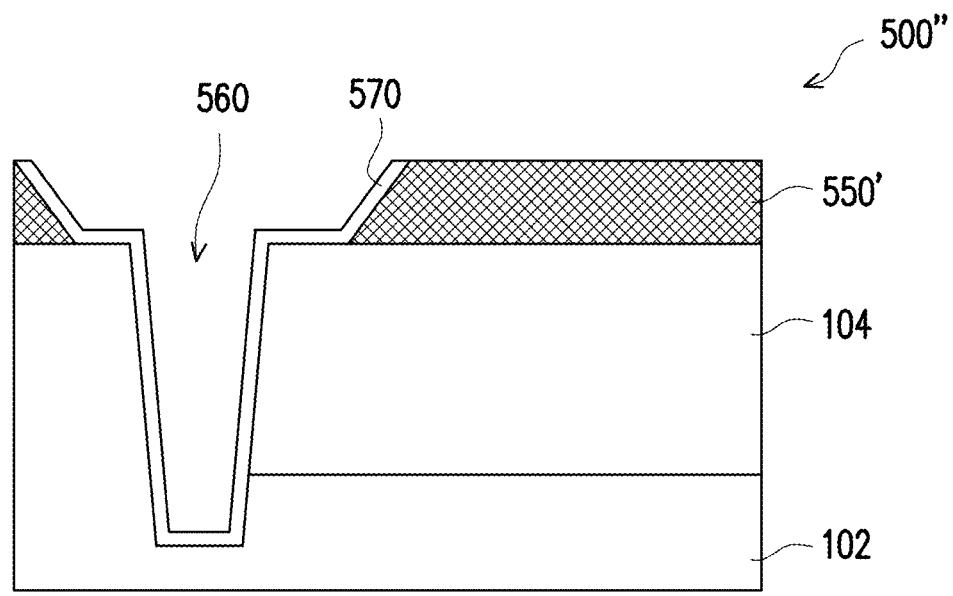

FIG. 5C is a cross-sectional view of a low noise device 500" following deposition of a liner 570. In some embodiments, low noise device 500" is a structure following operation 406. In comparison with low noise device 500', low noise device 500" includes liner 570 along substrate 102, channel 104 and mask 550'. Liner 570 includes a dielectric material, such as silicon oxide, silicon nitride, silicon carbide, silicon oxynitride or another suitable dielectric material. In some embodiments, liner 570 is deposited using PVD, CVD, sputtering or another suitable deposition process.

Figure 5D:
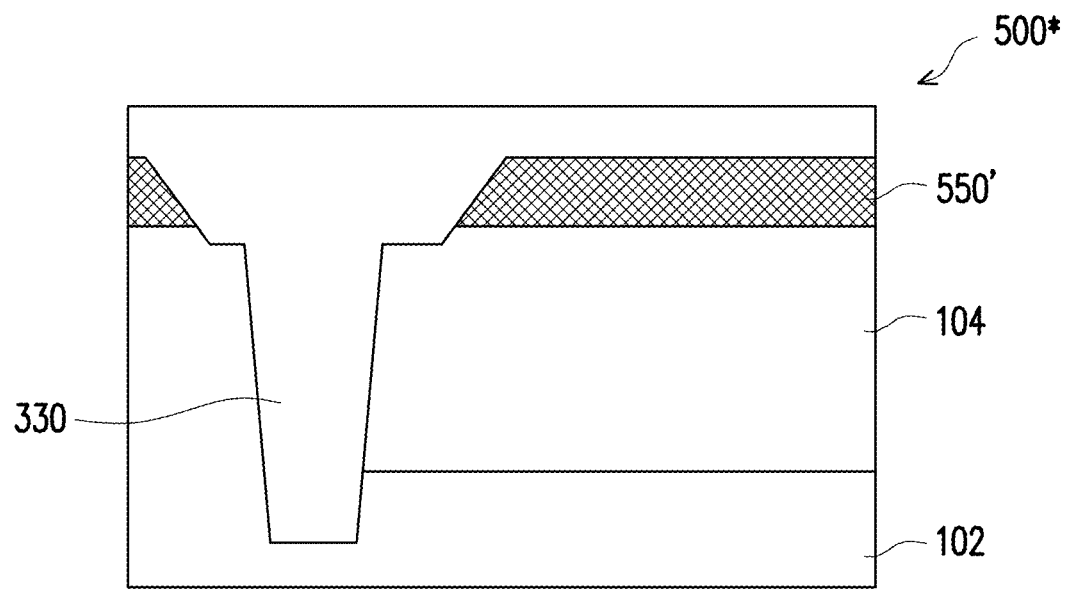

FIG. 5D is a cross-sectional view of a low noise device 500* following filling trench 560 with a dielectric material. In some embodiments, low noise device 500* is a structure during operation 410. In comparison with low noise device 500", low noise device 500* includes isolation feature 330 formed by filling trench 560 with the dielectric material. Isolation feature 330 includes a dielectric material, such as silicon oxide, silicon nitride, silicon carbide, silicon oxynitride or another suitable dielectric material. Isolation feature 330 protrudes above mask 550'. In some embodiments, isolation feature 330 is deposited using PVD, CVD, sputtering or another suitable deposition process. Liner 570 is not shown because isolation feature 330 is a same material as liner 570, so liner 507 is not distinguishable from isolation feature 330, in some instances. In some embodiments, liner 570 is a different material from isolation feature 330.

Figure 5E:
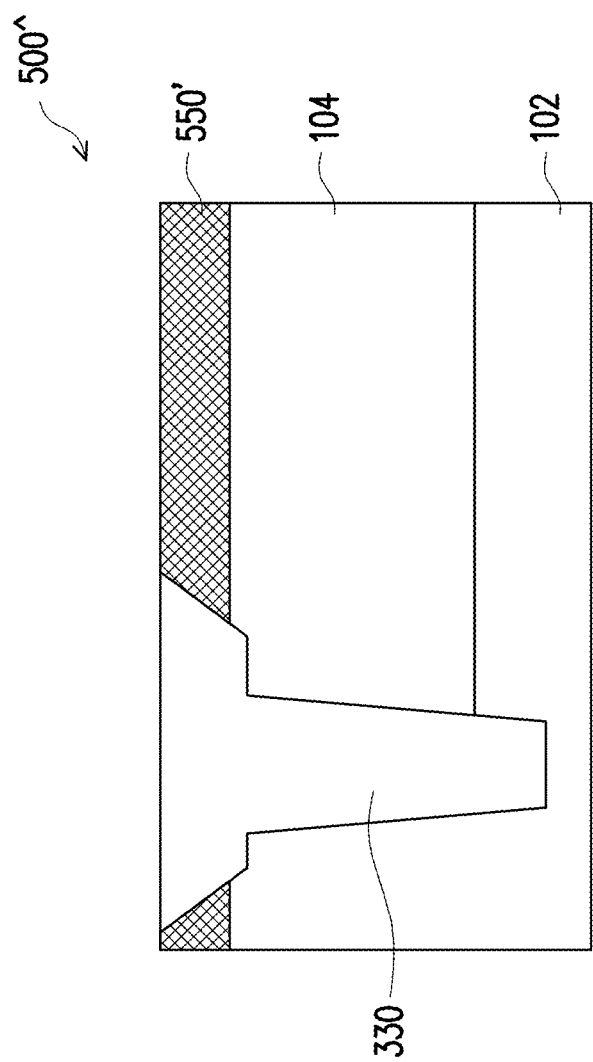

FIG. 5E is a cross-sectional view of a low noise device 500^ following a planarization process. In some embodiments, low noise device 500* is a structure following operation 410. In comparison with low noise device 500*, low noise device 500^ includes isolation feature 330 having a top surface substantially co-planar with a top surface of mask 550'.

Figure 6A:
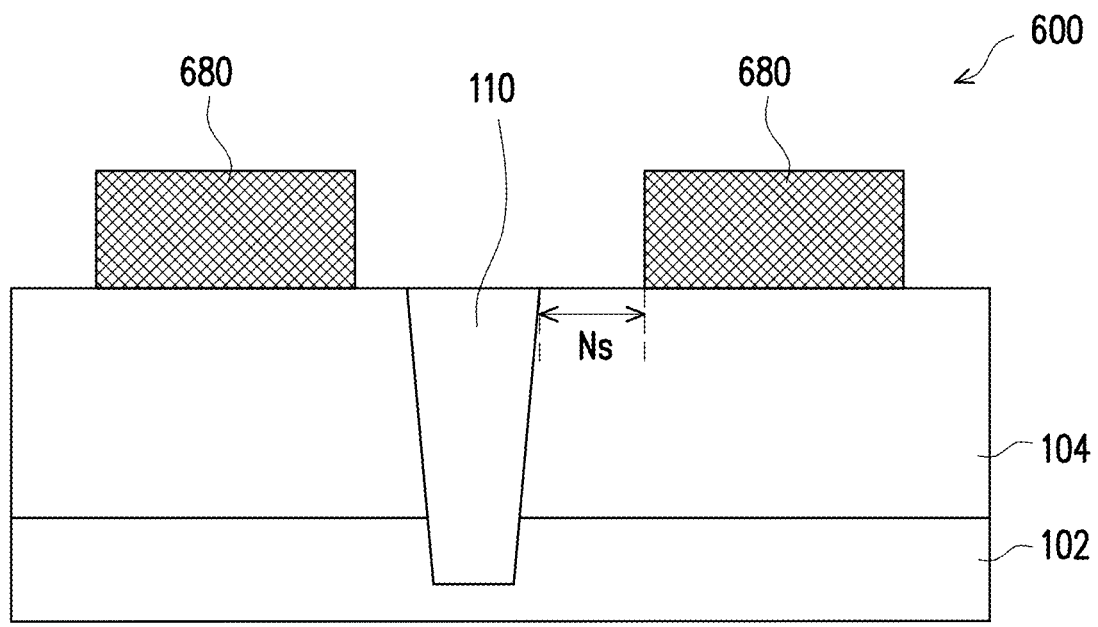
FIGS. 6A-6D are cross-sectional views of a low noise device during various stages of processing in accordance with some embodiments.
Figure 6B:
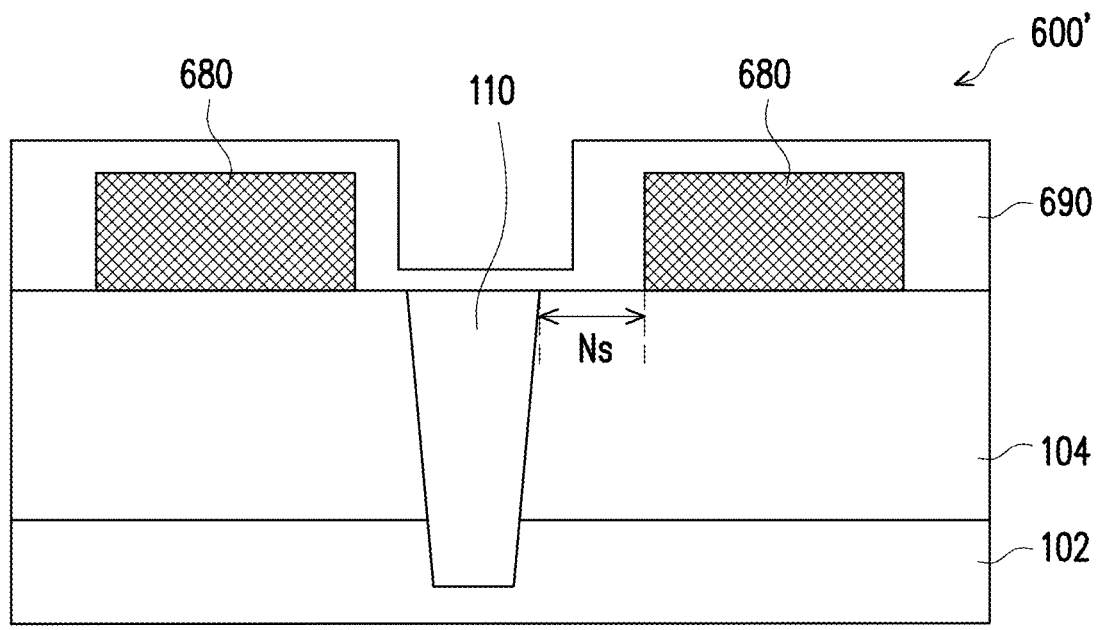
Figure 6C:
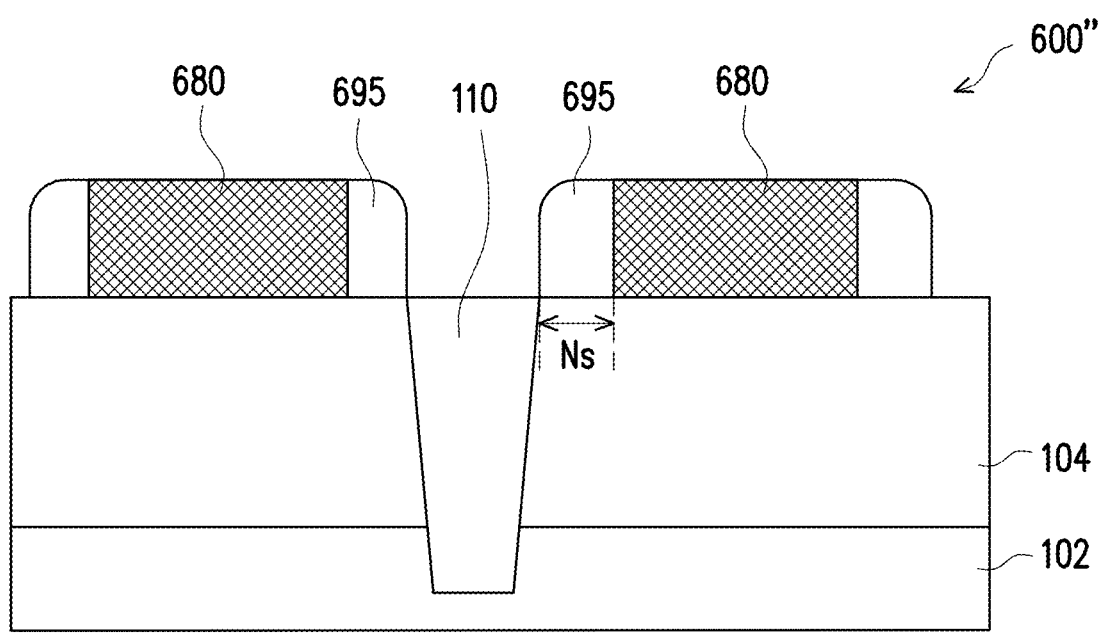

FIGS. 6A-6C are cross-sectional views of a low noise device during various stages of processing in accordance with some embodiments. The process indicated in FIGS. 6A-6C is usable in place of the mask pull back operation 404 (FIG. 4) in order to form an overhang in accordance with some embodiments. The process indicated by FIGS. 6A-6C are performed between operation 410 and operation 414 of method 400 in accordance with some embodiments.

FIG. 6A is a cross-sectional view of a low noise device 600 following filling of a trench with dielectric material to form isolation feature 110. Elements in low noise device 600 which are the same as low noise device 100 (FIG. 1A) have a same reference number. FIG. 6A includes channels 104 on both sides of isolation feature 110. In comparison with low noise device 100, low noise device 600 includes a mask 680 over channel 104. Mask 680 is patterned in to expose a portion of channel 104 adjacent to isolation feature 110. A distance of channel 104 exposed between an edge of mask 680 and an edge of isolation feature 110 is distance Ns (FIG. 3A).

In some embodiments, mask 680 is a hard mask, such as silicon nitride, silicon oxynitride, or another suitable hard mask. In some embodiments, mask 680 includes a photoresist. Mask 680 is formed by blanket depositing a mask material using CVD, PVD, spin-on coating or another suitable deposition process. The mask material is then patterned and etched to define mask 680. In some embodiments, the etching process is a dry etching process. In some embodiments, the etching process is a wet etching process. In some embodiments where mask 680 is a hard mask, patterning the mask material includes depositing a photoresist over the mask material.

FIG. 6B is a cross-sectional view of a low noise device 600' following deposition of a dielectric material 690. Dielectric material 690 is deposited over mask 680, isolation feature 110 and the portion of channel 104 between mask 680 and isolation feature 110. In some embodiments, dielectric material 690 is silicon oxide, silicon carbide, silicon nitride, silicon oxynitride or another suitable dielectric material. In some embodiments, dielectric material 690 is a same material as a material of isolation feature 110. In some embodiments, dielectric material 690 is a different material from that of isolation feature 110. In some embodiments, dielectric material is deposited using PVD, CVD or another suitable deposition process.

FIG. 6C is a cross-sectional view of a low noise device 600" following etching of dielectric material 690 to define spacing elements 695. Spacing elements 695 extend from mask 680 to isolation feature 110. A height of spacing elements 695 is substantially equal to a height of mask 680. In some embodiments, an anisotropic etching process is used to etch dielectric material 690 in order to define spacing elements 695. The etching process exposes a top surface of isolation structure 110.

Figure 6D:
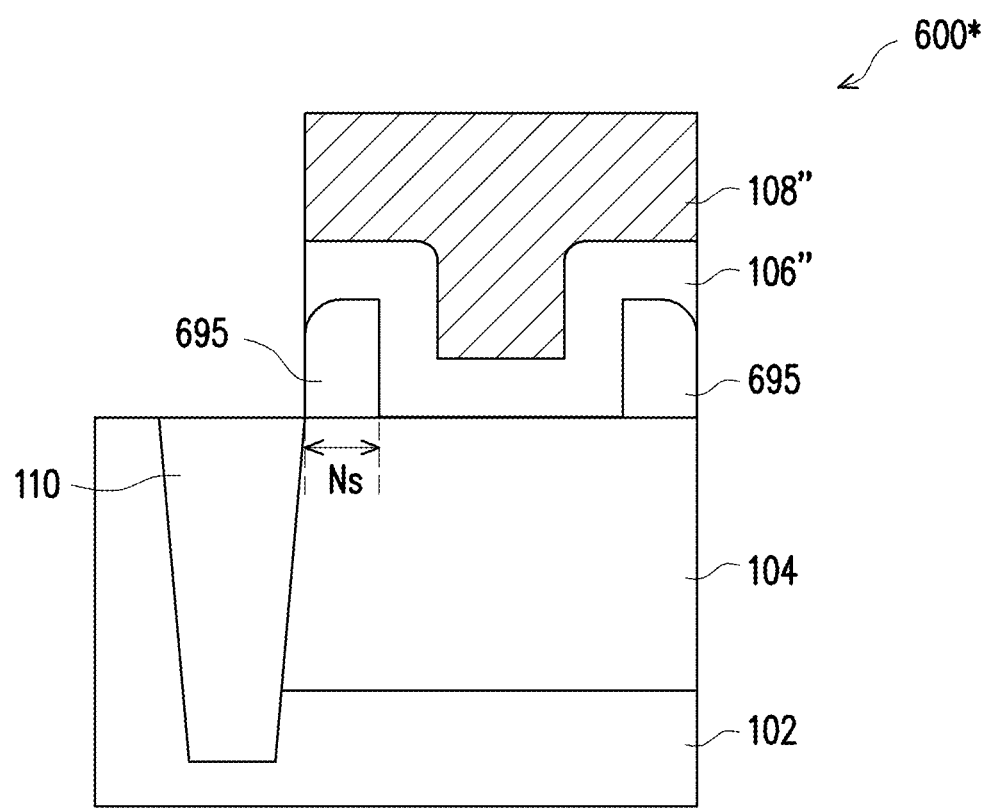

FIG. 6D is a cross-sectional view of a low noise device 600* following removal of mask 680 and deposition of gate dielectric layer 106" and gate electrode layer 108". Gate dielectric layer 106" is similar to gate dielectric layer 106 (FIG. 1A). In comparison with gate dielectric layer 106, gate dielectric layer 106" extends above spacing elements 695 on both sides of channel 104. Gate electrode layer 108" is similar to gate electrode layer 108. In comparison with gate electrode layer 108, gate electrode layer 108" has a thicker central portion over a portion of channel 104 exposed by spacing elements 695. In some embodiments, low noise device 600" includes at least one of an implant region, e.g., implant region 112 (FIG. 1A) or implant region 112' (FIG. 1B), or a contact region, e.g., contact region 220 (FIG. 2A). The inclusion of the implant region or the contact region will help to reduce the amount of charge trapping at an interface between isolation feature 110 and channel 104.

In comparison with the low noise devices in FIGS. 3A-3D, low noise device 600" has a top surface of isolation feature 110 substantially level with a top surface of channel 104. All of the low noise devices in FIGS. 3A-3D and low noise device 600" include a dielectric material extending over a portion of channel 104 for a distance Ns. The dielectric material extending over the portion of channel 104 helps to reduce an amount of charge trapping at a top corner of channel 104 adjacent to isolation features, e.g., isolation feature 110 (FIG. 6D) or isolation feature 330 (FIGS. 3A-3D). As discussed above, reducing the number of trapped charge carriers reduces the risk of trapped charge carriers escaping from the channel/isolation feature interface and causing fluctuations in a current through a transistor.

An aspect of this description relates to a low noise device. The low noise device includes an isolation feature in a substrate. The low noise device further includes a gate stack over a channel in the substrate, wherein the isolation feature is adjacent to the channel. The low noise device further includes a spacer surrounding a portion of the gate stack, wherein an edge of the gate stack is spaced from an edge of the isolation feature adjacent to the spacer by a distance ranging from a minimum spacing distance to about 0.3 microns ($\mu$m). In some embodiments, the edge of the gate directly contacts an inner sidewall of the spacer. In some embodiments, the gate stack extends along a top surface of the spacer. In some embodiments, a depth of the isolation feature in the substrate is greater than a depth of the channel in the substrate. In some embodiments, an outer sidewall of the spacer includes a first portion substantially perpendicular to a top surface of the substrate; and a second portion over the first portion, wherein the second portion is curved. In some embodiments, the gate stack directly contacts the second portion of the outer sidewall of the spacer. In some embodiments, the gate stack comprises a gate electrode, and a central portion of the gate electrode is thicker than a peripheral portion of the gate electrode. In some embodiments, the low noise device further includes an implant region between the isolation feature and the channel. In some embodiments, the implant region surrounds the isolation feature in the substrate. In some embodiments, the low noise device further includes a contact region in the substrate, wherein the isolation feature is between the channel and the contact region.

An aspect of this description relates to a low noise device. The low noise device includes an isolation feature in a substrate, wherein the isolation feature has a first depth in the substrate. The low noise device further includes a gate stack over a channel in the substrate, wherein the isolation feature is adjacent to the channel, and the channel has a second depth in the substrate less than the first depth. The low noise device further includes a spacer surrounding a lower portion of the gate stack, wherein an edge of the lower portion of the gate stack is spaced from an edge of the isolation feature by a distance ranging from a minimum spacing distance to about 0.3 microns ($\mu$m). In some embodiments, the gate stack further comprises an upper portion extending over a top surface of the spacer. In some embodiments, the upper portion of the gate stack contacts an outer sidewall of the spacer. In some embodiments, the low noise device further includes an implant region between the isolation feature and the channel. In some embodiments, the implant region surrounds the isolation feature in the substrate. In some embodiments, the low noise device further includes a contact region in the substrate, wherein the isolation feature is between the channel and the contact region. In some embodiments, the contact region has a third depth less than the second depth.

An aspect of this description relates to a method of making a low noise device. The method includes forming a channel in a substrate. The method further includes forming an isolation feature in the substrate, wherein the isolation feature is adjacent to the channel. The method further includes forming a spacer on the substrate, wherein a first sidewall of the spacer is aligned with the isolation feature. The method further includes forming a gate stack on the substrate, wherein a first portion of the gate stack is surrounded by the spacer, and the first portion of the gate stack is spaced from an edge of the isolation feature by a distance ranging from a minimum spacing distance to about 0.3 microns ($\mu$m). In some embodiments, the method further includes implanting dopants into the substrate to define an implant region between the isolation feature and the channel. In some embodiments, the method further includes implanting dopants into the substrate to define a contact region, wherein the isolation feature is between the contact region and the channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A low noise device comprising:
an isolation feature in a substrate;
a gate stack over a channel in the substrate, wherein the isolation feature is adjacent to the channel, and the gate stack comprises a gate electrode, and a central portion of the gate electrode is thicker than a peripheral portion of the gate electrode; and
a spacer surrounding a portion of the gate stack, wherein an edge of the gate stack is spaced from an edge of the isolation feature adjacent to the spacer by a distance ranging from a minimum spacing distance to about 0.3 microns ($\mu$m), and the spacer fails to overlap the isolation feature.

2. The low noise device of claim 1, wherein the edge of the gate stack directly contacts an inner sidewall of the spacer.

3. The low noise device of claim 1, wherein the gate stack extends along a top surface of the spacer.

4. The low noise device of claim 1, wherein a depth of the isolation feature in the substrate is greater than a depth of the channel in the substrate.

5. The low noise device of claim 1, wherein an outer sidewall of the spacer comprises:
   a first portion substantially perpendicular to a top surface of the substrate; and
   a second portion over the first portion, wherein the second portion is curved.

6. The low noise device of claim 5, wherein the gate stack directly contacts the second portion of the outer sidewall of the spacer.

7. The low noise device of claim 1, further comprising an implant region between the isolation feature and the channel.

8. The low noise device of claim 7, wherein the implant region surrounds the isolation feature in the substrate.

9. The low noise device of claim 1, further comprising a contact region in the substrate, wherein the isolation feature is between the channel and the contact region.

10. A low noise device comprising:
    an isolation feature in a substrate, wherein the isolation feature has a first depth in the substrate;
    a gate stack over a channel in the substrate, wherein the isolation feature is adjacent to the channel, and the channel has a second depth in the substrate less than the first depth; and
    a spacer surrounding a lower portion of the gate stack, wherein an edge of the lower portion of the gate stack is spaced from an edge of the isolation feature by a distance ranging from a minimum spacing distance to about 0.3 microns ($\mu$m), and the spacer fails to overlap the isolation feature.

11. The low noise device of claim 10, wherein the gate stack comprises a gate electrode, and a central portion of the gate electrode is thicker than a peripheral portion of the gate electrode.

12. The low noise device of claim 10, wherein the gate stack further comprises an upper portion extending over a top surface of the spacer.

13. The low noise device of claim 12, wherein the upper portion of the gate stack contacts an outer sidewall of the spacer.

14. The low noise device of claim 10, further comprising an implant region between the isolation feature and the channel.

15. The low noise device of claim 14, wherein the implant region surrounds the isolation feature in the substrate.

16. The low noise device of claim 10, further comprising a contact region in the substrate, wherein the isolation feature is between the channel and the contact region.

17. The low noise device of claim 16, wherein the contact region has a third depth less than the second depth.

18. A method of making a low noise device, the method comprising:
    forming a channel in a substrate;
    forming an isolation feature in the substrate, wherein the isolation feature is adjacent to the channel;
    forming a spacer on the substrate, wherein a first sidewall of the spacer is aligned with the isolation feature; and
    forming a gate stack on the substrate, wherein a first portion of the gate stack is surrounded by the spacer, the first portion of the gate stack is spaced from an edge of the isolation feature by a distance ranging from a minimum spacing distance to about 0.3 microns ($\mu$m), and the spacer fails to overlap the isolation feature.

19. The method of claim 18, further comprising implanting dopants into the substrate to define an implant region between the isolation feature and the channel.

20. The method of claim 18, further comprising implanting dopants into the substrate to define a contact region, wherein the isolation feature is between the contact region and the channel.

* * * * *